(12) United States Patent
Bixby

(10) Patent No.: US 9,564,891 B1
(45) Date of Patent: Feb. 7, 2017

(54) LOW CONDUCTED EMISSION SOLID STATE SWITCH

(71) Applicant: Crydom, Inc., San Diego, CA (US)

(72) Inventor: Bryan Bixby, Chula Vista, CA (US)

(73) Assignee: Crydom, Inc., San Diego, CA (US)

( * ) Notice: Subject to any disclaimer, the term of this patent is extended or adjusted under 35 U.S.C. 154(b) by 0 days.

(21) Appl. No.: 14/925,694

(22) Filed: Oct. 28, 2015

(51) Int. Cl.
*H03K 17/72* (2006.01)
*H03K 17/687* (2006.01)

(52) U.S. Cl.
CPC .......... *H03K 17/6871* (2013.01); *H03K 17/72* (2013.01)

(58) Field of Classification Search
USPC ........ 327/427–428, 434, 436–437, 445, 453, 327/460, 482, 484
See application file for complete search history.

(56) References Cited

U.S. PATENT DOCUMENTS

| | | |
|---|---|---|
| 4,071,810 A | 1/1978 | Dobbert |
| 4,131,937 A | 12/1978 | Pelly et al. |
| 4,176,288 A | 11/1979 | Komatsu et al. |
| 4,636,830 A | 1/1987 | Bhagat |
| 4,745,311 A * | 5/1988 | Iwasaki ............ H03K 17/08124 327/428 |
| 4,924,109 A | 5/1990 | Weber |
| 4,933,831 A | 6/1990 | Takahashi et al. |
| 4,943,840 A | 7/1990 | Roggwiller |
| 4,945,266 A | 7/1990 | Mori |
| 5,444,273 A | 8/1995 | Ueno |
| 5,463,231 A | 10/1995 | Ogura et al. |
| 5,528,188 A | 6/1996 | Au et al. |
| 5,825,600 A | 10/1998 | Watt |
| 7,498,862 B2 * | 3/2009 | Ayyagari ............. H03K 17/102 307/141.8 |
| 8,129,788 B1 | 3/2012 | Walker et al. |
| 8,461,881 B2 * | 6/2013 | Park ....................... H03K 17/28 327/108 |

(Continued)

FOREIGN PATENT DOCUMENTS

| | | |
|---|---|---|
| CN | 2310432 Y | 3/1999 |
| CN | 103683862 A | 3/2014 |
| JP | H046797 A | 1/1992 |

OTHER PUBLICATIONS

Hsu et al., Reverse-conducting Insulated Gate Bipolar Transistor with an Anti-parallel Thyristor, Proceedings of The 22nd International Symposium on Power Semiconductor Devices & ICs, Hiroshima, Japan, pp. 149-152, 2010.

(Continued)

*Primary Examiner* — An Luu
(74) *Attorney, Agent, or Firm* — Banner & Witcoff, Ltd.

(57) ABSTRACT

A solid state switch may include a plurality of inputs, such as to receive a control signal to cause the solid state relay to selectively deliver power from an AC power source to an electrical load (e.g., a heater, a pump, a lighting source, a motor, etc.). The solid state switch may include at metal-oxide-semiconductor field-effect transistors (MOSFETs) connected in a series opposition arrangement, where a gate of each of the MOSFETs may be electrically connected to a corresponding one of the plurality of inputs. A signal output from the MOSFETs may provide a triggering signal at a gate input of each of a corresponding semiconductor switching device to close the solid state relay to enable power delivery from the AC power source to the electrical load.

20 Claims, 10 Drawing Sheets

(56) References Cited

U.S. PATENT DOCUMENTS

| | | |
|---|---|---|
| 8,742,456 B2 | 6/2014 | Akiyama et al. |
| 8,773,826 B2 | 7/2014 | Altolaguirre et al. |
| 9,419,602 B2 * | 8/2016 | Tousignant .......... H03K 17/136 |
| 2014/0042012 A1 | 2/2014 | Clement et al. |

OTHER PUBLICATIONS

Entringer et al., Partially Depleted SOI Body-Contacted MOSFET-Triggered Silicon Controlled Rectifier for ESD protection, EOS/ESD Symposium 06-166, pp. 4A.1-1-4A.1-6, ©2006 ESDA.

* cited by examiner

600

| Run # | Test Performed | Limit | Result | Margin |
|---|---|---|---|---|
| 1 | CE, AC Power,240V/60Hz Solid State Switch 1 | Class B | Pass | 61.0 dBμV @ 0.164 MHz (-4.3 dB) |
| 2 | CE, AC Power,240V/60Hz Solid State Switch 2 | Class B | Pass | 61.3 dBμV @ 0.162 MHz (-4.0 dB) |
| 3 | CE, AC Power,240V/60Hz Solid State Switch 3 | Class B | Pass | 51.0 dBμV @ 0.160 MHz (-14.0 dB) |
| 4 | CE, AC Power,240V/60Hz Solid State Switch 4 | Class B | Pass | 53.9 dBμV @ 0.159 MHz (-11.8 dB) |
| 5 | CE, AC Power,240V/60Hz Solid State Switch 5 | Class B | Pass | Refer to Run Below |
| 6 | CE, AC Power,240V/60Hz Solid State Switch 6 | Class B | Pass | Refer to Run Below |

| Run # | Test Performed | Limit | Result | Margin |
|---|---|---|---|---|
| 1 | CE, AC Power,240V/60Hz Solid State Switch 1 | Class B | Fail | 80.2 dBμV @ 0.158 MHz (+14.6 dB) |
| 2 | CE, AC Power,240V/60Hz Solid State Switch 2 | Class B | Fail | 79.0 dBμV @ 0.169 MHz (+14.0 dB) |
| 3 | CE, AC Power,240V/60Hz Solid State Switch 3 | Class B | Fail | 78.4 dBμV @ 0.164 MHz (+13.1 dB) |
| 4 | CE, AC Power,240V/60Hz Solid State Switch 4 | Class B | Fail | 78.2 dBμV @ 0.164 MHz (+12.9 dB) |
| 5 | CE, AC Power,240V/60Hz Solid State Switch 5 | Class B | Pass | 55.6 dBμV @ 0.159 MHz (-9.9 dB) |
| 6 | CE, AC Power,240V/60Hz Solid State Switch 6 | Class B | Pass | Refer to Run Below |

FIG. 6B

| Run # | Test Performed | Limit | Result | Margin |
|---|---|---|---|---|
| 1 | CE, AC Power,240V/60Hz Solid State Switch 7a | Class B | Pass | 50.0 dBµV @ 0.151 MHz (-15.9 dB) |
| 2 | CE, AC Power,240V/60Hz Solid State Switch 7b | Class B | Pass | 49.8 dBµV @ 0.151 MHz (-16.1 dB) |
| 3 | CE, AC Power,240V/60Hz Solid State Switch 8a | Class B | Pass | 51.6 dBµV @ 0.152 MHz (-14.3 dB) |
| 4 | CE, AC Power,240V/60Hz Solid State Switch 8b | Class B | Pass | 50.8 dBµV @ 0.155 MHz (-14.9 dB) |
| 5 | CE, AC Power,240V/60Hz Solid State Switch 9a | Class B | Pass | 53.0 dBµV @ 0.154 MHz (-12.8 dB) |
| 6 | CE, AC Power,240V/60Hz Solid State Switch 9b | Class B | Pass | 52.1 dBµV @ 0.159 MHz (-13.4 dB) |

FIG. 8A

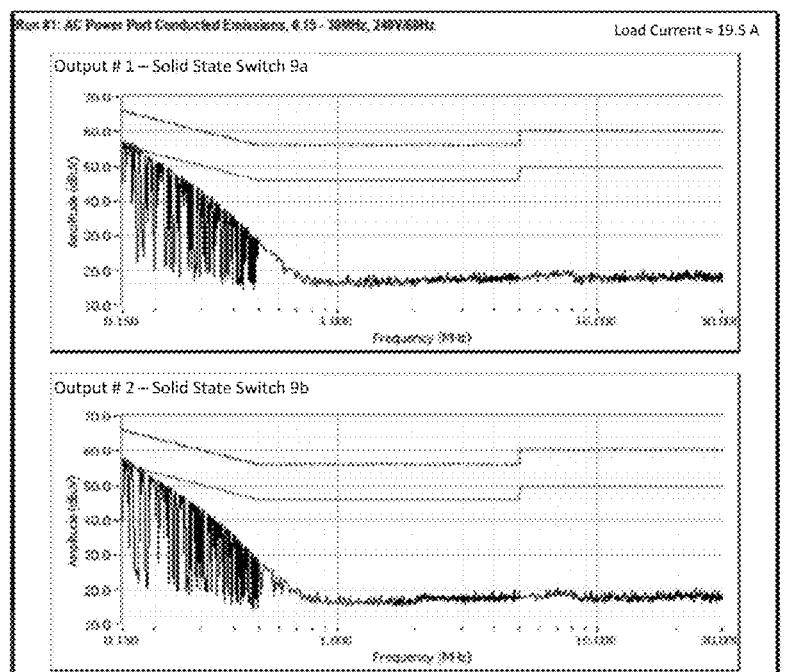

FIG. 8B

LOW CONDUCTED EMISSION SOLID STATE SWITCH

FIELD OF THE INVENTION

Aspects of the disclosure relate to solid state switches. More particularly, aspects of the disclosure relate to solid state switches, such as solid state relays, that eliminate or significantly reduce disturbances introduced onto an AC line.

BACKGROUND

Solid state switches, such as solid state relays, are electronic switching devices that may be controlled to turn on or off with the application of a small control voltage (e.g., a direct current (DC) voltage) across the device's control terminals. For example, the solid state switches may be used to control alternating current (AC) or a direct current (DC) provided to a load. Further, solid state switches offer greater performance and/or reliability than electromechanical switches or relay devices. In many cases, integrated circuit (IC) based switches, such as silicon controlled rectifiers (SCRs), TRIACs, gate turn-off thyristors, power transistors and the like, may be used as output switches within the solid state relay. In many cases, these IC-based switches may receive may be controlled from an external control circuit, where the control signal (e.g., a low-voltage DC voltage signal) may be isolated from the switch circuit by use of an optocoupler, a transformer or other such isolating device. This isolation may be used to avoid conducted electrical emissions from being introduced into the low voltage DC control circuitry. However, due to the nature of semiconductor-based devices (e.g., turn-on voltages, threshold voltages, etc.), the solid state switches may create transient disturbances on an AC supply line due to these properties of the IC based switches. These transient disturbances may cause radio frequency (RF) disturbances that may be introduced onto the AC supply line (e.g., conducted emissions) which, in turn, may interfere with the operation of other equipment using the same AC supply line. To minimize the effect of the conducted emissions, manufacturers of residential and/or industrial equipment may install external filters which increase the size and/or cost of their equipment. As such, a need has been recognized for a cost-efficient way to minimize the conducted emissions without the use, or at least minimizing the size, of external filtering devices.

SUMMARY

In some cases, a solid state switch may include one or more inputs for receiving a control signal, an input circuit for processing the received control signal to enable an output switch circuit to close the solid state switch so that power may be delivered from a power source to an electrical load (e.g., a heater, a lighting fixture, a motor, etc.). In some cases, the output circuit may include a first plurality of semiconductor switching devices, wherein the plurality of semiconductor switching devices, when enabled, are capable of selectively providing power to the electrical load from the power source. The input circuit may include a second plurality of semiconductor switching devices, where each of the second plurality of semiconductor switching devices may be electrically coupled to a gate input of a corresponding one of the first plurality of semiconductor switching devices. In some cases, each of the second plurality of semiconductor switching devices may behave as a primarily resistive load when enabled.

In some cases, the solid state switch may be a solid state relay. In some cases, the first plurality of semiconductor switching devices of the output circuit may comprise silicon controlled rectifiers (SCRs), triodes for alternating current (TRIACs), or gate turn-off thyristors (GTOs). The output circuit may further include a plurality of resistors, where each of the plurality of resistors is connected between a gate and a cathode of a corresponding one of the plurality of semiconductor switching devices. In some cases, the second plurality of semiconductor switching devices of the output circuit may comprise power metal-oxide-semiconductor field-effect transistors (MOSFETs). In some cases, the second plurality of semiconductor switching devices may comprise a pair of power metal-oxide-semiconductor field-effect transistors (MOSFETs) connected in a series opposition configuration. Further, the solid state switch may further optionally include one or more transient voltage suppressors (TVS) connected in parallel with the second plurality of semiconductor switching devices.

In some examples, the solid state switch may be configured such that a level of conducted emissions introduced onto an alternating current (AC) line electrically connected between the solid state switch and the voltage source may be less than a maximum allowable threshold amount specified in a conducted emissions standard. In some examples, the level of conducted emissions introduced onto the AC line electrically connected between the solid state switch and the voltage source may be less than 60 dBµV.

In some cases, a system for controlling power delivery to a load from an alternating current (AC) source may include a solid state switch. The solid state switch may include a plurality of inputs electrically connected to a control circuit. The control circuit may be external to the solid state switch and may provide a command to trigger the solid state switch to close. In some cases, the control circuit may provide a direct current (DC) control signal to the plurality of inputs for enabling or disabling the solid state switch. Further, the control circuit may be electrically isolated from the plurality of inputs of the solid state switch, such as by using a plurality of optoisolators and/or a transformer. The solid state switch may include a plurality of outputs electrically for providing a switchable electrical connection between a power source and a load, wherein the command to trigger the solid state switch to close results in power delivery from the power source to the load. In some cases, an amount of conducted emissions introduced onto power lines between the AC source and the solid state switch may be at least 10 percent less than a threshold associated with a maximum allowable amount of conducted emissions introduced onto the power lines as defined by a conducted emissions standard.

In some cases, the solid state switch may further include an input circuit and an output circuit. The input circuit may be electrically coupled to the plurality of inputs, where the input circuit may include two or more metal-oxide-semiconductor field-effect transistors (MOSFETs) connected in a series opposition configuration for providing a triggering signal to close the solid state switch to cause power delivery from the power source to the load. In some cases, the output circuit may be electrically coupled to the input circuit and the plurality of outputs, where the output circuit may include a plurality of solid state switching device and each of the two or more MOSFETS may be electrically connected to a gate input of a corresponding one of the plurality of solid state switching devices.

In some cases, the solid state switch may comprise a solid state relay. In some cases, the triggering signal, as provided by the MOSFETSs in series opposition configuration, may result in a minimized step current output at the plurality of outputs.

In some cases, a solid state relay may include a plurality of inputs, such as to receive a control signal to cause the solid state relay to selectively deliver power from an AC power source to an electrical load (e.g., a heater, a pump, a lighting source, a motor, etc.). The solid state relay may also include at least two metal-oxide-semiconductor field-effect transistors (MOSFETs) connected in a series opposition arrangement, where a gate of each of the at least two MOSFETs may be electrically connected to a corresponding one of the plurality of inputs. The solid state relay may also include at least two semiconductor switching devices, each comprising a gate input, where a signal output from each of the at least two MOSFETs may provide a triggering signal at the gate input of each of a corresponding semiconductor switching device to close the solid state relay to enable power delivery from the AC power source to the electrical load.

Of course, the methods and systems of the above-referenced embodiments may also include other additional elements, steps, computer-executable instructions, or computer-readable data structures. In this regard, other embodiments are disclosed and claimed herein as well.

The details of these and other embodiments of the present invention are set forth in the accompanying drawings and the description below. Other features and advantages of the invention will be apparent from the description and drawings, and from the claims.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein:

FIGS. 6A and 6B are illustrative charts showing the results of conducted emissions testing for different designs of solid state switches at different load currents;

FIGS. 8A-8B show illustrative test results and waveforms resulting from conducted emissions testing of solid state switches.

It will be apparent to one skilled in the art after review of the entirety disclosed that the steps illustrated in the figures listed above may be performed in other than the recited order, and that one or more steps illustrated in these figures may be optional.

DETAILED DESCRIPTION

In the following description of the various embodiments, reference is made to the accompanying drawings, which form a part hereof, and in which is shown by way of illustration, various embodiments of the disclosure that may be practiced. It is to be understood that other embodiments may be utilized.

Figure 1:
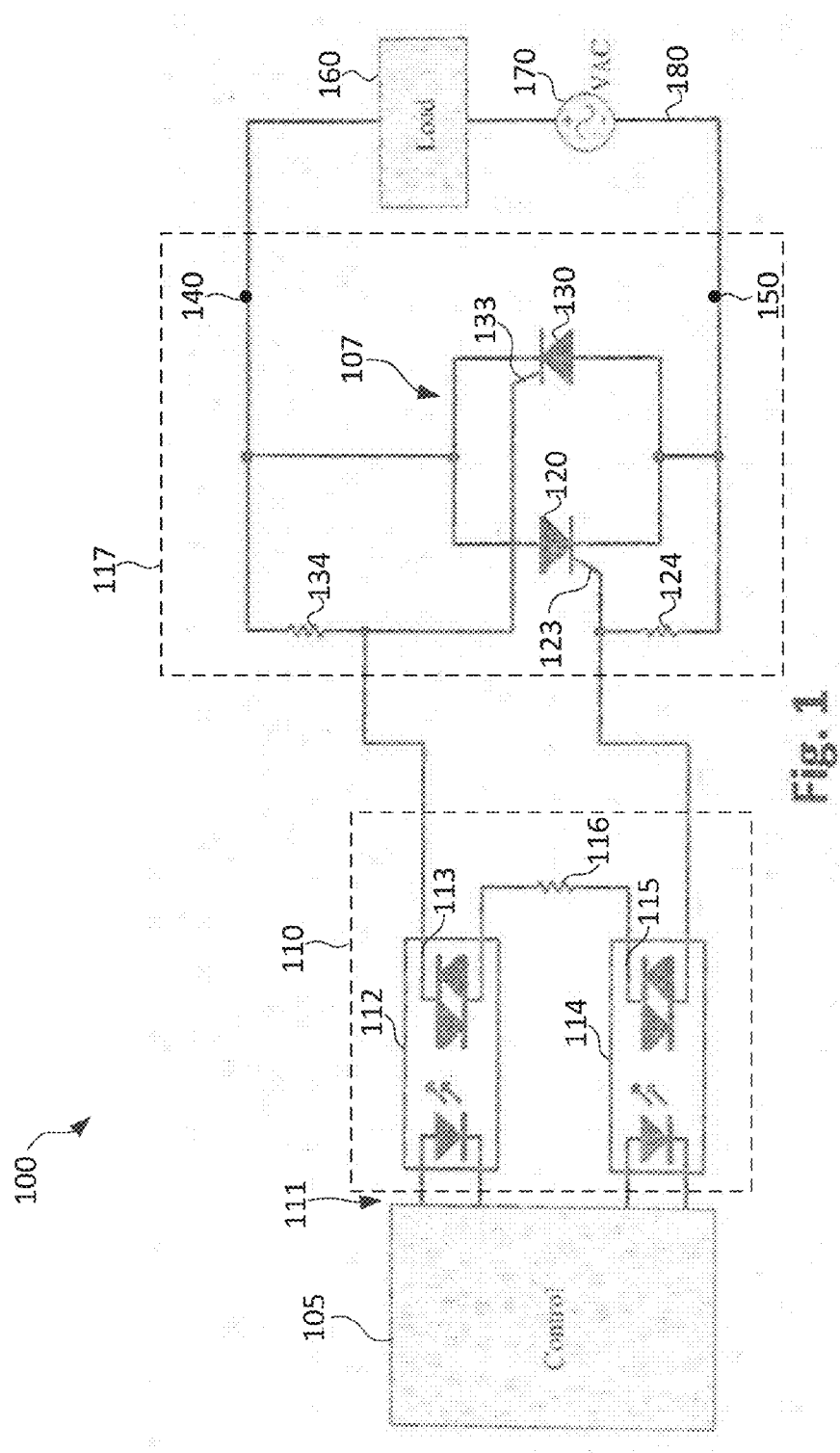
FIG. 1 shows an illustrative block diagram of a solid state switch using optocouplers to isolate the control line from the output switching devices of the solid state switch.

FIG. 1 shows an illustrative block diagram of a solid state switch (e.g., a solid state relay 100, a solid state contactor, etc.) having a configuration that reflects the current products used in industry. The solid state relay 100 may be controlled by a control circuit 105 that may be electrically connected to the solid state relay 100 via one or more input terminals 111. The control circuit 105 may be used to control the operation of the solid state relay 100 to cause a switch circuit 117 to enable a desired output (e.g., a desired voltage, a desired current, etc.) to be provided from a power source 170 to a load 160 via output terminals 140, 150.

In an illustrative example, the solid state relay 100 may include an input circuit 110 and an output switch circuit 117. The input circuit 110 may include an optoisolator and/or an optocoupler circuit comprising one or more devices (e.g., an optocoupler 112, an optocoupler 114, a resistor 116, etc.) that may be used to provide an optically isolated trigger signal to the output circuit 117. In some cases, the input circuit 110 may be configured to provide a gating signal to a gate 123 of a first semiconductor switch a gate 133 of a second semiconductor switch, such as the silicon controlled rectifiers (SCRs) SCR 120 and SCR 130, respectively. In some cases, different semiconductor switches may be used such as gate turn-off thyristors (GTOs), triodes for alternating current (TRIACs), insulated gate bipolar transistors (IGBTs), and/or the like. The input circuit 110 may include a resistor 116 in series with the optocoupler 112 and the optocoupler 114. This resistor 116 may be sized to limit current flow within the control circuit of the solid state relay 100. The solid state relay 100 may be electrically coupled to a control circuit 105 via two or more input terminals 111 of the solid state relay. In some cases, the control circuit 105 may be used to generate one or more control signals to cause the solid state switch to selectively open and close.

Referring to FIG. 1, the semiconductor switches of the output switch circuit 117 (e.g., SCR 120 and SCR 130) may be triggered into a conduction state by a current flowing through resistor 124 and/or the resistor 134, the output TRIACs of the optocouplers 112 and 114 (e.g., the TRIAC 113 and the TRIAC 115) and the gate of the relevant SCR, 120 or 130. As can be seen, the SCR 120 and the SCR 130 are configured in a back-to-back configuration and may be triggered into a conduction state by enabling TRIAC 113 of optocoupler 112 and TRIAC 115 of optocoupler 115 via one or more control signal received from the control circuit 105. When enabled, the forward voltage drop of each of the optocouplers 112, 114 is about 1.0 volt, at low current levels, resulting in about a 2 volt level being present before the associated SCR 120 or SCR 130 is activated. Further, each of the SCR 120 and the SCR 130 has a reverse voltage characteristic between the gate and cathode along with a gate-to-cathode threshold voltage of the particular SCR, in parallel with the voltage drop of across R124 and R134, to be turned on. Thus, before each of the SCR 120 and the SCR 130 is enabled, the voltage at output terminals 140 and 150 of the solid state switch may be within a range near 3.75 volts (e.g., from about 3.5 volts to about 4.0 volts, etc.). However, when the SCR 120 and the SCR 130 of the switch circuit 107 are activated, the voltage at the output terminals 140, 150 may drop to near 0.9 volts. In other words, when the SCR 120 and the SCR 130 are enabled ("switched on") in response to a control signal provided by the control circuit 105, the voltage level at the output terminals 140, 150 may experience a step change of about 3.0 volts. This step change further results in a step increase in load voltage and, accordingly, the load current.

Such transient changes in voltage and/or current may result in an electrical disturbance being conducted on the power lines 180. Such transient changes to the voltage and/or current signal may also result in conducted emissions being introduced onto the power lines over a range of frequencies (e.g., about 150 KHz to about 500 KHz, up to 30 MHz, etc.). In many cases, one or more industry or governmental standards. For example, such industry and/or governmental standards may include the European Standard EN 55014-1, also known as CISPR 14-1, the Federal Communication Commission (FCC) standard FCC part 15B, and the like, which are included herein in their entirety by reference to at least define allowable conducted emission levels at different power levels and/or allowable conducted emission levels based on specified devices or applications. These standards may be introduced in a jurisdiction to limit such conducted emissions to be within an allowable range to minimize any detrimental effect caused by the conducted emissions on other devices that may be sharing the same power lines 180. In current applications, a user of solid state switches may be forced to install expensive filters to reduce any introduced conducted emissions to be within allowable levels. For example, the standard CISPR 14-1 may include one or more sections regarding electromagnetic compatibility, such as for defining acceptable limits on conducted emissions within a range of frequencies, such as limiting an allowable amount of conducted emissions at a main power connection and at a load power connection. By limiting the conducted emissions at the load terminals, the devices connected to the load terminals of the solid state relay (e.g., a motor, a heater, a lighting unit, etc.) may have a longer lifetime. Similarly, by limiting the allowable amount of conducted emissions that may be conducted back onto the main power lines (e.g., incoming), other devices that share the same power line may experience less performance degradation due to the amount of conducted emissions and/or may experience a longer life-span. In an illustrative example, a household appliance may include a solid state relay used to control the operation of a motor (e.g., turn the motor on and/or off). In many cases, one or more of the industry or governmental standard may include a section defining acceptable limits of conducted emissions that may be introduced to a power line (e.g., a mains power line, a load power line, etc.). In some cases, the AC power source may comprise a power source capable of providing a single phase AC voltage or a three phase AC voltage. The AC voltage that may be provided from the power source may range from about 110 Volts AC to about 600 Volts AC at either 50 Hz or 60 Hz. In many cases, even a relatively small voltage change (e.g., about 2 V, about 3 V, about 4 V, etc.) may result in a high change in current.

Further, the amount of conducted emissions (e.g., an average level and/or a quasi-peak level) that may be allowable (e.g., from about 56 dBμV to about 66 dBμV, etc.) within the one or more power ranges (e.g., between about 150 KHz and about 500 KHz, between about 500 KHz and about 5 MHz, between about 5 MHz and about 30 MHz), where the amount of allowable conducted emissions may vary by the power level of a load (e.g., a rated motor power not exceeding about 700 watts, a rated motor power above 700 watts and not exceeding 1 kilowatt, a rated motor power greater than 1 kW, etc.), the location of where emissions may be measured (e.g., at the mains terminals, at load terminals, etc.) and/or by a type of equipment (e.g., vacuum cleaners, household appliances and similar equipment, tools, equipment classified as class A group 2 equipment, equipment classified as class B group 2 equipment, and/or the like). To meet these emissions levels a manufacturer and/or user may install expensive filters or other equipment to minimize the amount of conducted emissions produced by an installed device. In some cases, the filters installed by a user may increase the required space necessary to install the desired components, thus further increasing space requirements and costs associated with meeting these increased space requirements. For example, a user may need to purchase a larger than necessary enclosure to be able to install a required filter. In many cases, even a small step change in voltage and/or current may introduce conducted emissions that may meet or exceed the allowable limits set forth in the applicable standards.

In typical applications, solid state switches, such as the solid state relay 100, may be electrically isolated so as to not introduce noise (e.g., conducted emissions) into a lower power control circuit, particularly in relation to the output circuit. For example a solid state switch may be configured to receive a control signal in the range of about 3 VDC to about 32 VDC, from about 18 VAC to about 36 VAC, and/or from about 90 VAC to about 280 VAC. In many cases, an input current drawn by the solid state switch may be minimized, for example, within a range of about 2 mA to about 4 mA. In such cases, the input switch circuit 110 may include an optically coupled low power transistor, or other such low power semiconductor switching device, to provide a turn-on voltage at the gate of the SCRs 120, 130 of the output switch circuit 107.

However, as discussed above, many jurisdictions (e.g., Europe, the United States, Canada, etc.) may have enacted standards to minimize an effect that an installed electrical device may have on the connected power system. For example, one or more standards may require that equipment powered by shared power lines do not transmit emissions back onto the supply line and/or the load lines. As discussed above, the semiconductor threshold voltages of the optocouplers, or other low level switching devices, when combined with the threshold voltage of the SCR may cause a voltage level (e.g., about 5 volts, etc.) to be present at the output terminals of the solid state switch. Once the devices of the output switch circuit 107 are triggered, the voltage level at the output terminals 140, 150 of the solid state relay may fall to about 1 volt. This nearly instantaneous drop in voltage may cause a corresponding transient step up in current on the supply line, which, while small, may be large enough to generate conducted emissions on the supply line and/or the load lines within the regulated frequency range(s). Such step responses in voltage and/or currents are composed of signals over a wide range of frequencies. For example, a step increase may include one or more conducted emissions components within a range from about 150 kHz to about 500 kHz. Such transient step increases may also include emission components at higher frequencies, such as within the range to about 30 MHz According to aspects of this disclosure, this step response may be nearly eliminated, or at least minimized, by replacing the low power switching devices (e.g., the TRIACs 113 and 115 of the optocouplers 112 and 114) with high power field effect transistors (FETs), such as power metal-oxide-semiconductor field-effect transistors (MOSFETs) due to the characteristics of the power FET devices. For example, when a power MOSFET is active, the characteristics of the device cause the MOSFET to act similarly to a resistor. In other words, the operating mode for the MOSFET device may result in a near constant current, which corresponds to a nearly stable equivalent resistance (e.g., $R_{DS(ON)}$). Another advantage of MOSFETs is that these devices require very little current to turn on (e.g., less than about 1 mA) while having a much higher output rating (e.g., about 10 A, about 50 A, etc.). MOSFETs may be n-channel or a p-channel. In some cases, such as for n-channel MOSFETS, the gate may be biased positive relative to the source biasing. If a signal is applied to a power MOSFET, a series resistance characteristic of the MOSFET may be the same regardless of a direction of the current. In the illustrative example of FIGS. 2 and 3, the MOSFET devices are shown in series opposition arrangement, where both of the MOSFET devices are of the same type (e.g., both are n-channel, both are p-channel, etc.).

Figure 2:
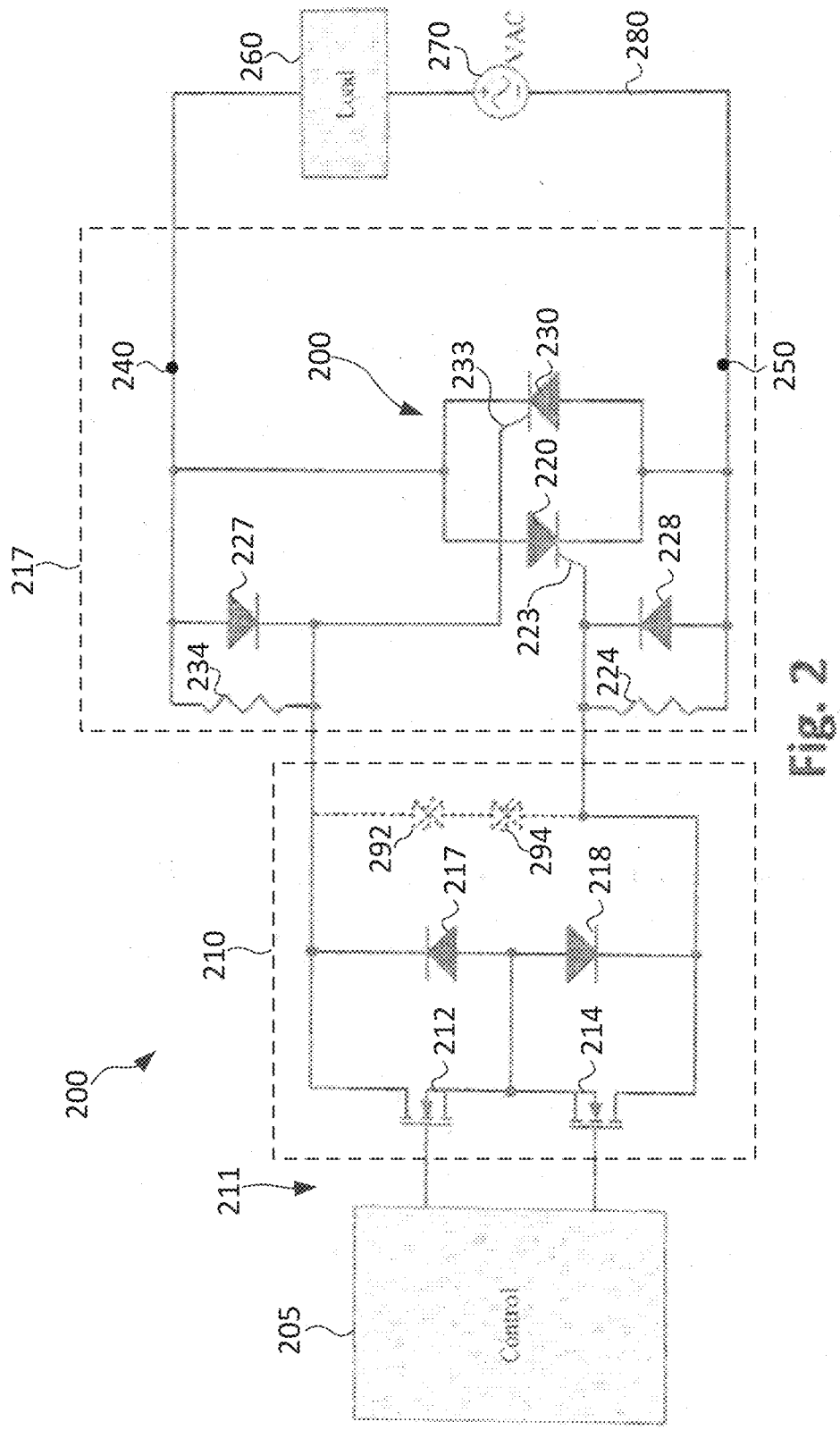
FIGS. 2 and 3 show a block diagram of illustrative solid state switches that include power transistors for controlling the switching of the output switching devices according to aspects of this disclosure.
Figure 3:
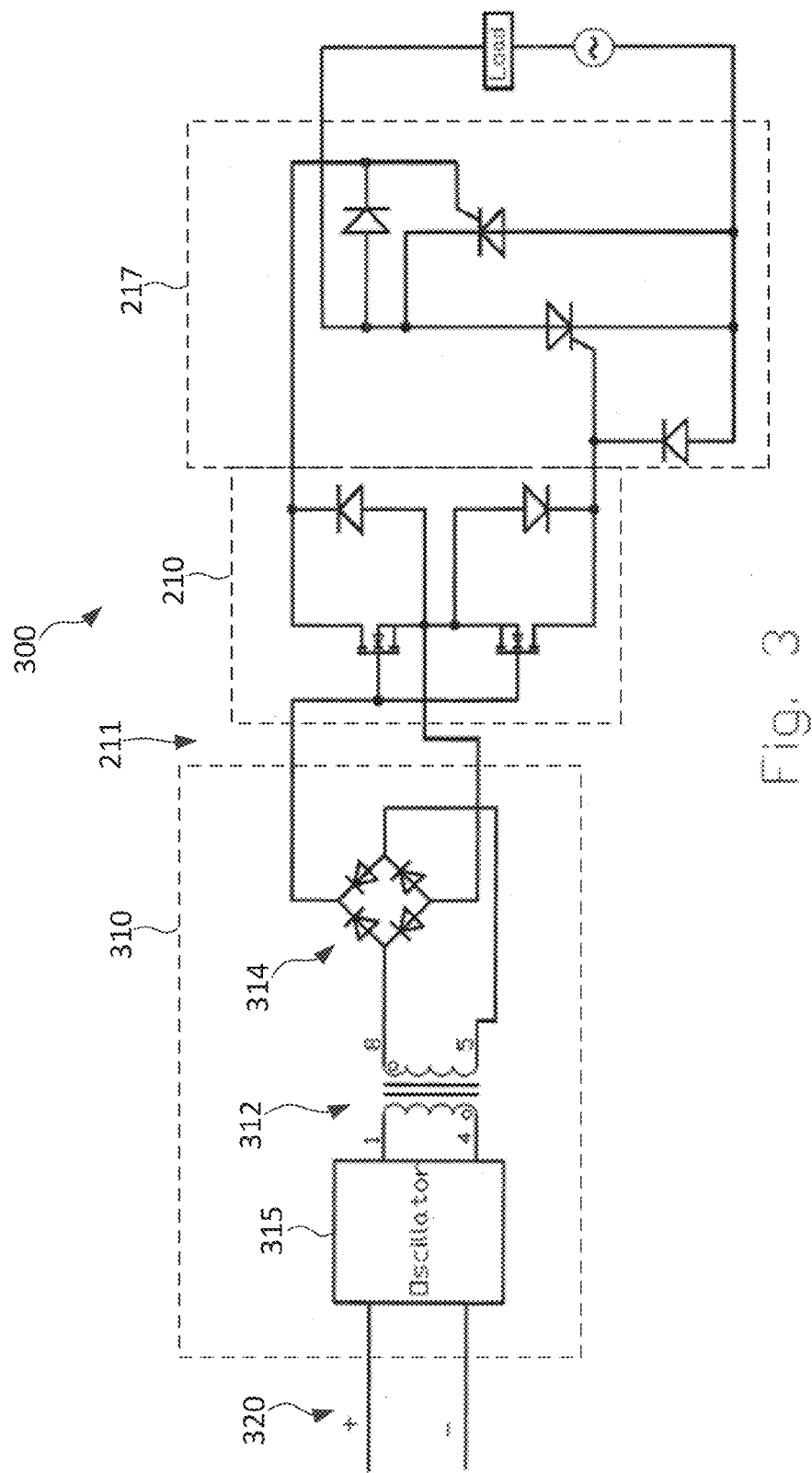

FIGS. 2 and 3 show block diagram of illustrative solid state switches (e.g., solid state relays 200 and 300, solid state contactors, etc.) that may include a plurality of semiconductor devices having a resistive effect on the circuit when active (e.g., power MOSFETs in a series opposition configuration) for controlling the switching of the silicon controlled rectifiers (SCRs) according to aspects of this disclosure. In the illustrative example of FIG. 2, the solid state relay 200 is similar to that of the solid state relay illustrated in FIG. 1, with a difference being that the optocouplers 112, 114 have been replaced with power MOSFET 212 and power MOSFET 214. In some cases, the power MOSFET 212 and the power MOSFET 214 are configured to be in a series opposition configuration. Further, in some cases, a further difference may be the use of diodes 227 and 228 that have been added in antiparallel with the gate to cathode of each SCR 220 and 230.

The solid state relay 200 may be controlled by a control circuit 205 that may be electrically connected to the solid state relay 200 via one or more input terminals 211. The control circuit 205 may be used to control the operation of the solid state relay 200 to cause a switch circuit 207 to enable a desired output (e.g., a desired voltage, a desired current, etc.) to be provided from a power source 270 to a load 260 via output terminals 240, 250.

In an illustrative example, the solid state relay 200 may include a power MOSFET circuit 210 (e.g., the MOSFET 212, the MOSFET 214, the diode 217, the diode 218, etc.) that may be used to provide an control signal to the gates 223, 233 of the SCR 220 and the SCR 230. In some cases, one or more transient voltage suppressors (TVS) (e.g., TVS 292 and the TVS 294) may optionally be connected in parallel with the power MOSFETs 212 and 214, where TVS 292 and TVS 294 may be sized so that the power ratings of the MOSFETs 212 and 214 can be minimized. For example, a TVS may be used to absorb transient energy and may be sized to handle very large peak currents. The TVS devices 292 and 294. By properly sizing and installing the TVS devices, the power rating requirement for the power MOSFETs 220 and 230 installed in the solid state relay 220 may be reduced. For example, an installed TVS may provide overvoltage protection for the power MOSFETs and/or other components of the solid state relay. In some cases, a MOSFET for use in a solid state relay 220 for a 480V application may be sized to have approximately 2 or 3 times the voltage rating, so that the MOSFETs chosen to be installed in the solid state relay 200 may have a voltage rating of about 1200 volts. However, with the additional overvoltage protection provided by the TVS devices 292 and 294, the MOSFETs may be chosen based on a lower voltage rating requirement (e.g., approximately 1000V). As such, costs associated with the chosen MOSFETs can be reduced. In many cases, the MOSFETs may be the most expensive components of the solid state relay 200. Thus, by minimizing the cost of the MOSFETs 212, 214, the costs of the solid state relay can be reduced as a whole.

As mentioned above, the power MOSFETs 212 and 214 and the anti-parallel diodes 217 and 218 are used in place of the optoisolator circuit 110 of FIG. 1. Further differentiating the solid state relay 200 of FIG. 2 from the solid state relay 100 of FIG. 1 is the addition of the low $V_f$ Schottky diodes 227 and 228 in antiparallel with the gate to cathode of each SCR 220 and 230. In this configuration, the output of the SCRs 220 and 230 are turned on by turning on the diodes 228 and 227 which, in turn, connects the gate of the forward biased SCR. Once the current reverses, the current flows with no interruption. Here, the load current may flow through the diode 227 when the forward voltage drop across resistor 223 reaches 0.1 volts. Current then may flow through diode 228 or diode 227, and the resistors 224 and 234 until the threshold voltage of the SCR gate to cathode is reached.

In an illustrative example, when operating in the saturation region, the resistance $R_{DS(on)}$ of MOSFET 212 and MOSFET 214 may be about 4.5 Ohms, each, for a total of about 9 Ohms. With a current of approximately 20 mA, the voltage drop across the diode 227 or the diode 228, whichever is forward biased, of 0.1 volts, plus the voltage drop across the MOSFET 212 and the MOSFET 214, in series, thus the total voltage drop will sum to 0.3 volts, applied to the gate to cathode of the SCR 220 or the SCR 230. which is below a normal gate to cathode threshold voltage of the SCR 220 and the SCR 230, which is about 0.7 volts. As the load current through the triggering components (e.g., resistor 224 and diode 228 and resistor 234 and diode 227) nears the SCR 230 and SCR 220 gate to cathode voltage of approximately 0.7 volts, the load current begins to flow into the gate 232 of SCR 230. When the gate current flowing into the gate 232 reaches the current level for triggering the SCR 230, the SCR 230 turns on and load current is shared between the parallel path of the resistor 223 and diode 227 and the gate of SCR 230. As such, no sudden change in load is encountered and, therefore, no high frequency conducted emissions are created. As the load current increases, the current through the triggering path of the SCRs remains approximately constant at an $I_{gt}$ level of the SCR 230, and the majority of the load current is also carried by the SCR 230. This uninterrupted turn on continues every half cycle until the gates of the power MOSFETS 212, 214 are turned off. In some cases, the resistors 223 and 224 may be used to ensure that the gates of the SCRs 230 and 220 are not floating and these resistors may, in some configurations, be optionally omitted.

In an illustrative example, the power MOSFETs 212 and 214 may be connected in series opposition and rated at the same voltage as the output SCRs. When enabled (e.g., a controlled to turn on), the power MOSFETs may be controlled to operate below a threshold voltage of the SCRs. In doing so, the conducted emissions may be reduced or eliminated. For example, tests have shown that for a 1 amp load, no conducted emissions were noticeable. In some cases, power MOSFETs may be used instead of the SCRs in the switching circuit, however SCRs and/or TRIACs are rugged components which may be capable of handling inrush current, unlike high power MOSFETs. For example, the power MOSFETs cannot handle the loads generated by an incandescent lamp because the corresponding inrush current may damage the transistors. Unlike these MOSFETs, SCRs are more robust.

The solid state relay 200 and 300 may be used to control AC voltage outputs that may be in the range of about 400 volts to about 600 volts AC at 50 Hz or 60 Hz. For controlling voltages in this range at the output of the solid state relay 200, the power MOSFETS 212 and 214 may each have a voltage rating of at least 1200 volts. However, if the optional TVS overvoltage protection is enabled, as shown in the inclusion of TVS 292 and TVS 294, then the voltage rating of the power MOSFETS 212 and 214 may be rated at 1000 volts each, which may result in a significant cost savings. Further, by using the power MOSFETS 212 and 214 in the power MOSFET circuit 210 the conducted emissions introduced back on to the power lines may drop dramatically.

In some cases, the load 260 may correspond to one or more different applications, such as a heater for washing machine or an injection molding machine, a light being turned on and off, a motor turned on and off, a pump, and/or anything other device that may be considered to be an electrical load.

FIG. 3 shows an illustrative solid state relay 300 and a control circuit 310 that may be similar to the control circuit 205. In some cases, the control circuit may include one or more optoisolators that may be used to isolate the control circuitry from the higher power load voltages. In other cases, such as in FIG. 3, a transformer 312 may be used to electrically isolate the lower power control circuitry from the higher load-side voltages. In an illustrative example, an oscillator 315 may be enabled using one or more control lines 320 to provide an AC voltage source at a defined frequency. The alternating voltage output may be electrically coupled to the solid state relay control circuitry via the transformer 312. The AC voltage may then be rectified, such as by using the bridge rectifier 314 and may be used to provide the DC gate signals to the power MOSFETS (e.g., the MOSFETS 212 and 214) of the solid state relay 320. Other DC sources for the gating signals may be used. The control signal may be controlled based on a defined duty cycle.

Figures 4A, 4B:
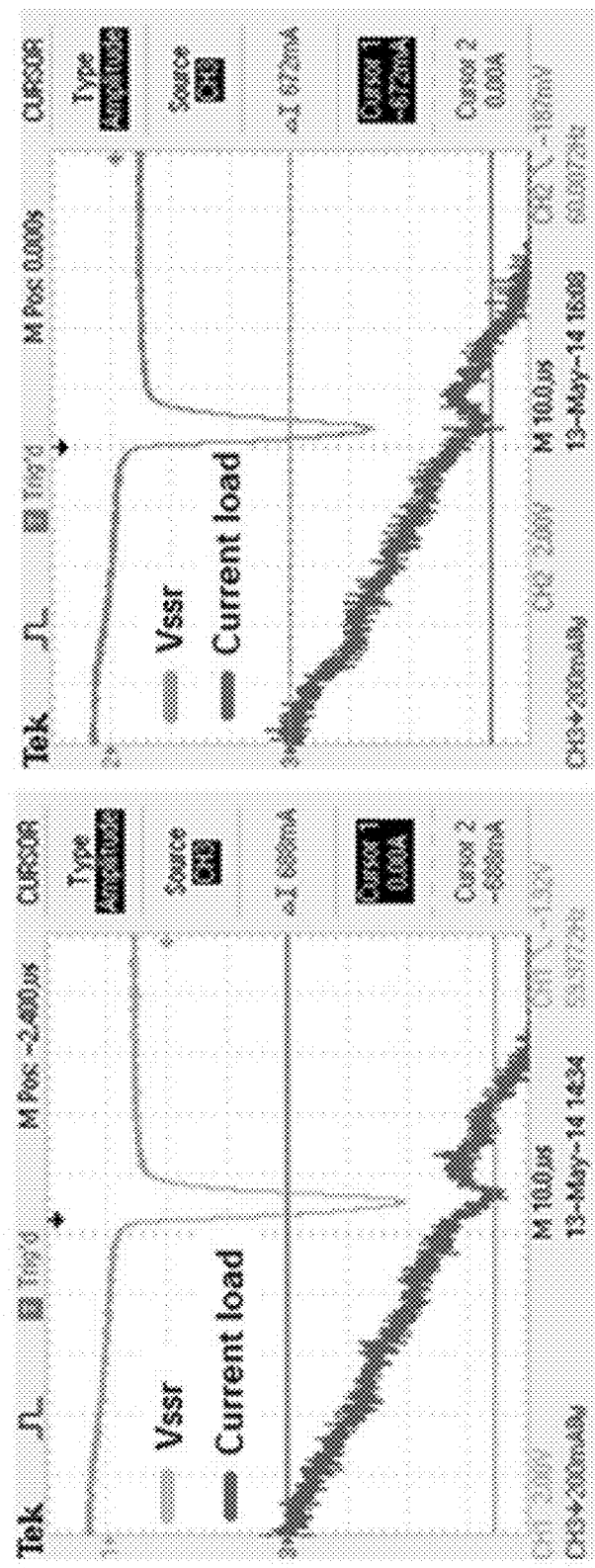
FIGS. 4A and 4B show illustrative waveforms showing results of conducted emissions testing of a solid state relay similar in design to the one shown in FIG. 1.
Figure 5B:
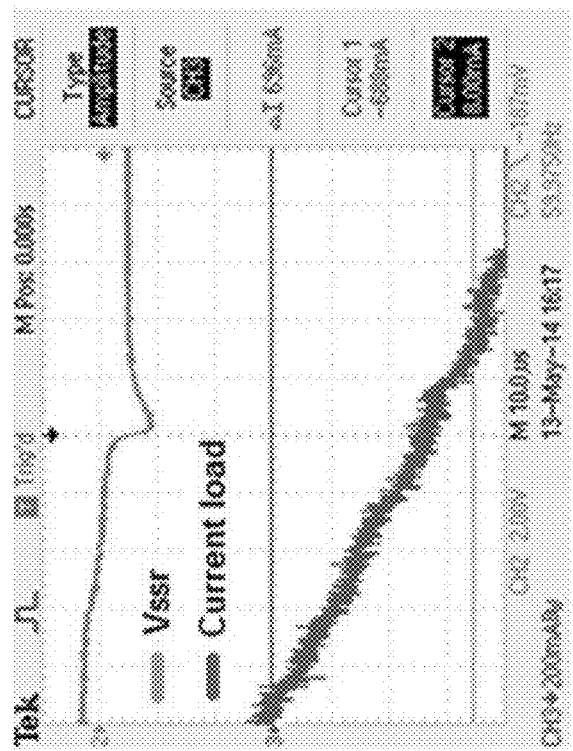
FIGS. 5A and 5B show illustrative waveforms showing results of conducted emissions testing of a solid state relay simulating the use of power MOSFETs for gating the output semiconductor switches.
Figure 5A:
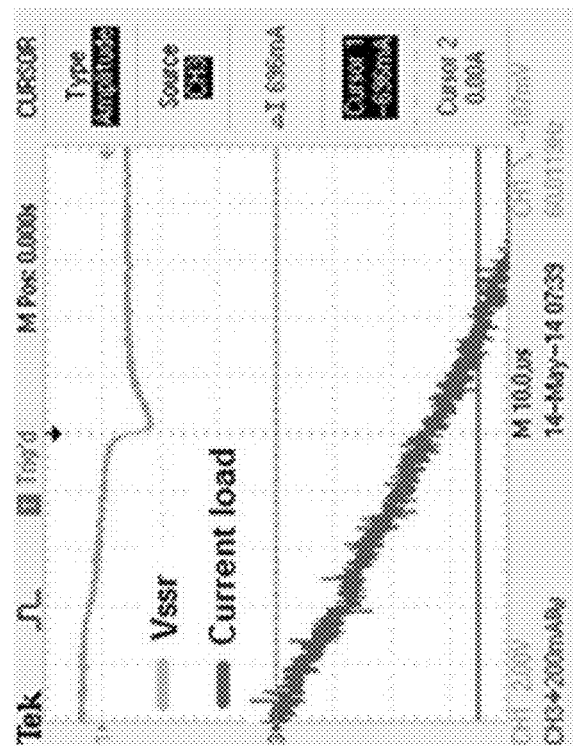
Figure 7A:
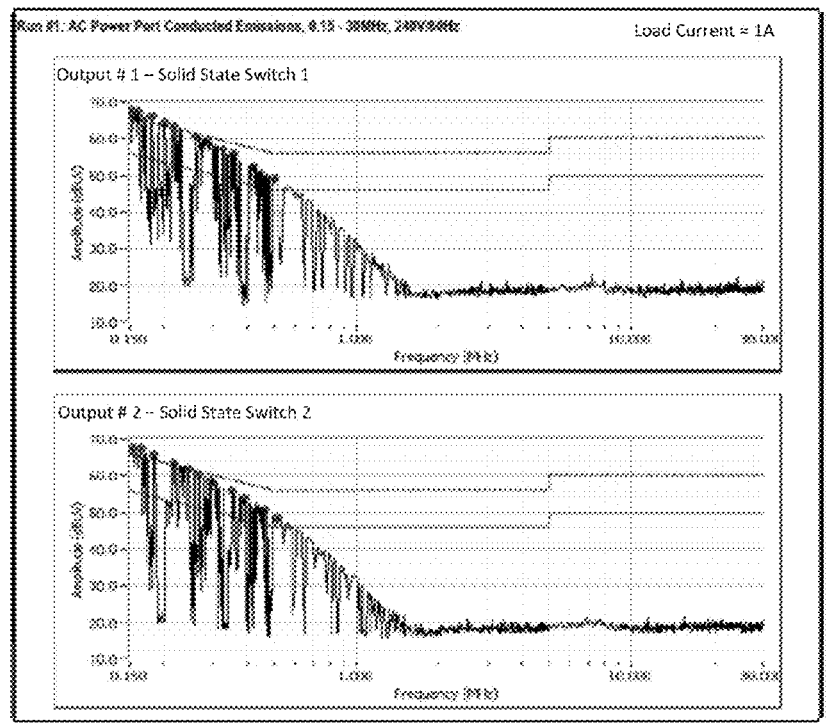
FIGS. 7A-7F show illustrative waveforms representative of measured conducted emissions tests performed on different designs of solid state switches at different load currents.
Figure 7B:
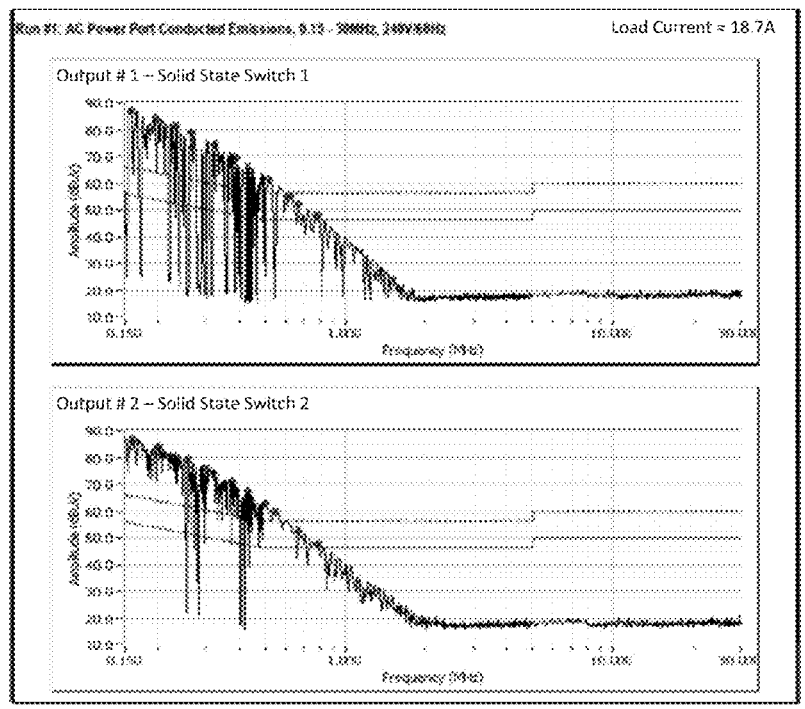
Figure 7C:
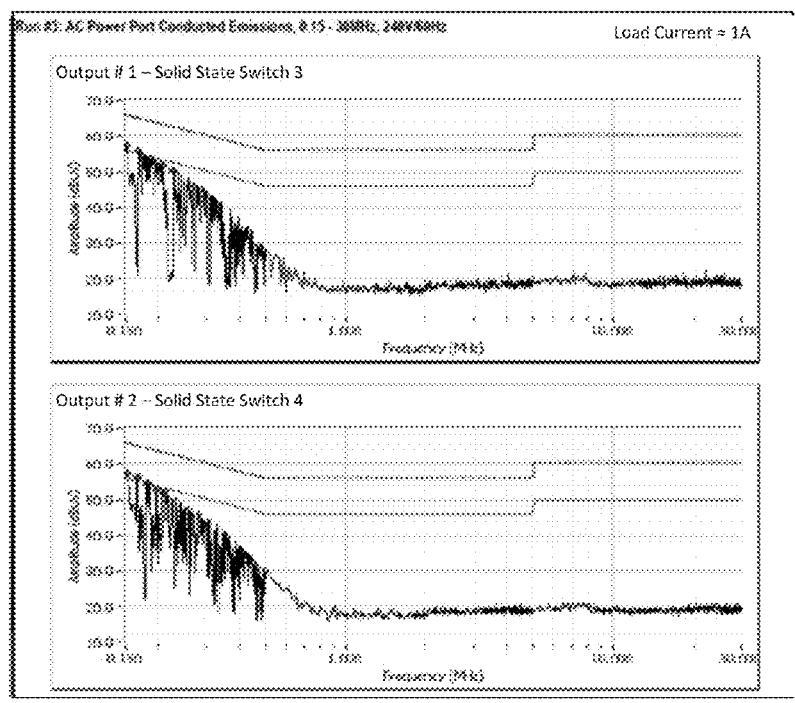
Figure 7D:
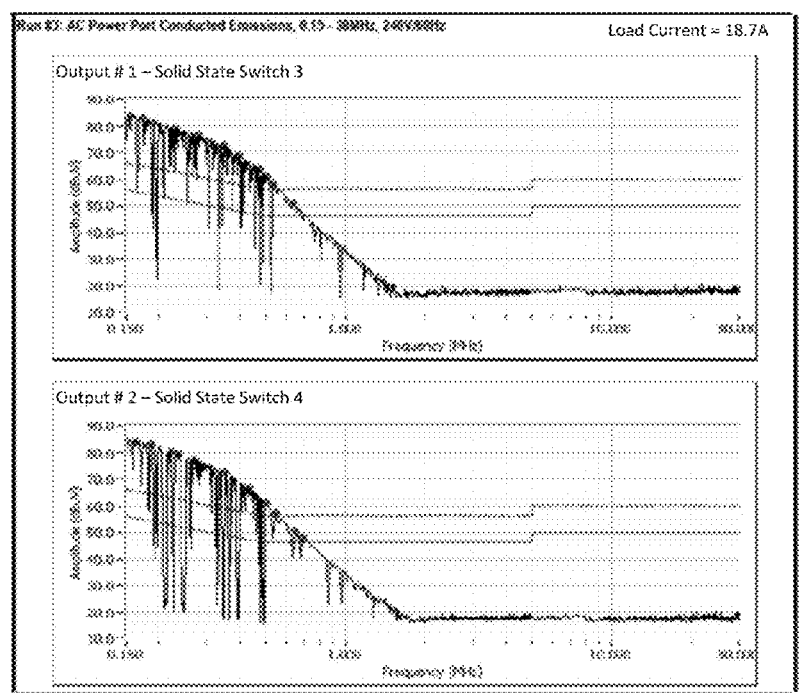
Figure 7E:
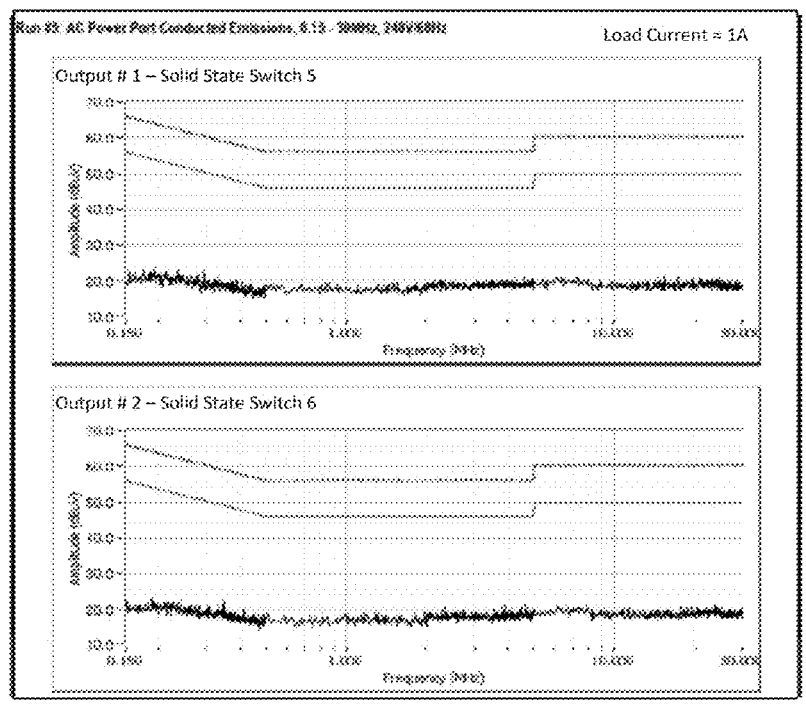

FIGS. 4A and 4B show illustrative waveforms showing results of conducted emissions testing of a solid state relay similar in design to the one shown in FIG. 1 and including optocoupler TRIACs to provide the gating signals to the gates of the switched semiconductors, where the reversal peak recovery current is shown to exhibit about a 200 mA current spike which may result in significant conducted emissions on the power lines supplying the load. Conversely, FIGS. 5A and 5B show illustrative waveforms showing results of conducted emissions testing of a solid state relay similar in design to the ones shown in FIGS. 2 and 3, but in which the MOSFETs in series opposition configuration were simulated using a resistor (e.g., a 10 Ohm resistor). In these figures, the current spike is shown to be negligible with respect to the same 200 mA scale. As such the conducted emissions are shown to be significantly reduced by using the power MOSFETS in supplying power to the switching semiconductors, which may be SCRs, TRIACs, and/or the like. In these tests, the load current FIGS. 6A and 6B are illustrative charts showing the results of conducted emissions testing for different designs of solid state switches at different load currents. For example, the chart 600 illustrates a test report comprising tests of different solid state switch modules having different designs. For example, solid state switches 1 and 2 represent solid state switches having a designed similar to those discussed above in reference to FIG. 1. Solid state switch modules 3 and 4 correspond to a solid state switch design for reducing conducted emissions (EMC) by including low threshold diodes and a low-value resistor (e.g., a zero ohm resistor) in the semiconductor (e.g., SCR) gating circuit. The solid state switch modules 5 and 6 correspond to solid state switches having a design representative of those shown in FIGS. 2 and 3. As can be seen in the "Margin" column of charts 600 and 650, the amount of conducted emissions may be proportional to a level of current drawn by the electrical load controlled by the solid state switch. For example, the amount of conducted emissions generated by the solid state switches is significantly higher, for all designs, at the 18.7 amp level of the tests shown in chart 650 as opposed to the emissions seen at the 1 amp level of the tests shown in chart 600. However, the solid state switch modules 5 and 6 had significantly less conducted emissions than the other designs of the solid state switch modules 1-4, as shown in FIGS. 7A, 7C, and 7E.

Figure 7F:
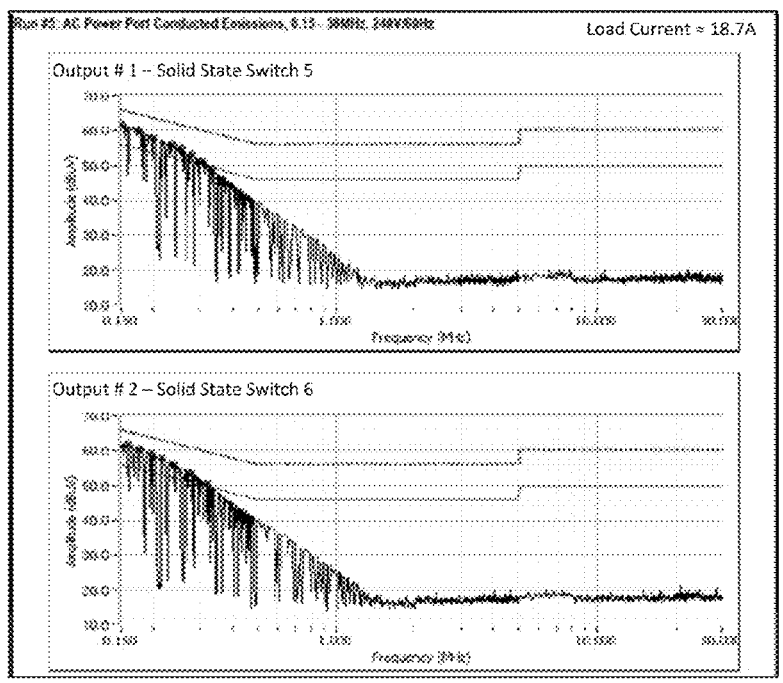

The chart 650 shows results of tests the same solid state switch modules 1-6 shown in chart 600. The difference between the tests shown in the charts is the load current through the solid state switch modules 1-6 was 18.7 Amps, as opposed to the 1 Amp load of the previous test. Again, as can be seen, the solid state switch modules 5 and 6 showed significantly less conducted emissions that were within the allowable range of the applicable conducted emissions standard (e.g., EN 55014-1), while the conducted emissions generated by solid state switch modules 1-4 exceeded the maximum allowable threshold. As such, the significant improvement obtained using the circuit of FIGS. 2 and 3 can easily be seen. FIGS. 7B, 7C and 7F show illustrative waveforms representative of measured conducted emissions tests performed on different designs of solid state switches at the higher load current (e.g., 18.7 Amps).

FIGS. 8A-8B show illustrative test results and waveforms resulting from conducted emissions testing of solid state switches. In these tests, each of the solid state switch modules 7a, 7b, 8a, 8b, 9a, and 9b all have the same design as shown in FIGS. 2 and 3. The difference being that the MOSFETs used in the different modules 7a and 7b, 8a and 8b, and 9a and 9b were sourced from different manufacturers. The load current for these tests was increased to 19.5 Amps. As can be seen, the manufacturer of the MOSFETS had little effect on the overall conducted emissions produced by the solid state switch modules, where each of the modules passed the limits of the conducted emissions tests as defined by the applicable standards.

While the aspects described herein have been discussed with respect to specific examples including various modes of carrying out aspects of the disclosure, those skilled in the art will appreciate that there are numerous variations and permutations of the above described systems and techniques that fall within the spirit and scope of the invention.

What is claimed is:
1. A solid state switch, comprising:
an output switch circuit comprising a first plurality of semiconductor switching devices, wherein the plurality of semiconductor switching devices selectively provide power to a load from a voltage source when enabled; and an input circuit comprising a second plurality of semiconductor switching devices, wherein each of the second plurality of semiconductor switching devices is electrically coupled to a gate of a corresponding one of the first plurality of semiconductor switching devices, wherein each of the second plurality of semiconductor switching devices comprises a primarily resistive characteristic when enabled.

2. The solid state switch of claim 1, wherein the solid state switch comprises a solid state relay.

3. The solid state switch of claim 1, wherein the first plurality of semiconductor switching devices comprises silicon controlled rectifiers (SCRs).

4. The solid state switch of claim 1, wherein the first plurality of semiconductor switching devices comprises a triode or triodes for alternating current (TRIACs).

5. The solid state switch of claim 1, further comprising a plurality of resistors, where each of the plurality of resistors is connected between a gate and a cathode of a corresponding one of the plurality of semiconductor switching devices.

6. The solid state switch of claim 5, further comprising a plurality of diodes, wherein each of the plurality of diodes is connected antiparallel with the gate to cathode of the corresponding one of the plurality of semiconductor switching devices.

7. The solid state switch of claim 1, wherein the second plurality of semiconductor switching devices comprise power metal-oxide-semiconductor field-effect transistors (MOSFETs).

8. The solid state switch of claim 1, wherein the second plurality of semiconductor switching devices comprise a pair of power metal-oxide-semiconductor field-effect transistors (MOSFETs) connected in a series opposition configuration.

9. The solid state switch of claim 1, further comprising one or more transient voltage suppressors (TVS) connected in parallel with the second plurality of semiconductor switching devices.

10. The solid state switch of claim 1, wherein a level of conducted emissions introduced onto an alternating current (AC) line electrically connected between the solid state switch and the voltage source is less than a maximum allowable threshold amount specified in a conducted emissions standard.

11. The solid state switch of claim 1, wherein a level of conducted emissions introduced onto an alternating current (AC) line electrically connected between the solid state switch and the voltage source is less than 60 dBµV.

12. A system for controlling power delivery to a load from an alternating current (AC) source, comprising:
a solid state switch comprising:
a plurality of inputs electrically connected to a control circuit, the control circuit providing a command to trigger the solid state switch to close;
a plurality of outputs electrically connected between a power source and a load, wherein the command to trigger the solid state switch to close results in power delivery from the power source to the load; and
wherein an amount of conducted emissions introduced onto power lines between the power source and the solid state switch are at least 10 percent less than a threshold associated with a maximum allowable amount of conducted emissions introduced onto the power lines as defined by a conducted emissions standard.

13. The system of claim 12, wherein the solid state switch further comprises:
an input circuit electrically coupled to the plurality of inputs, the input circuit comprising two or more metal-oxide-semiconductor field-effect transistors (MOSFETs) connected in a series opposition configuration for providing a triggering signal to close the solid state switch to enable power deliver from the power source to the load.

14. The system of claim 13, wherein the solid state switch further comprises:
an output circuit electrically coupled to the input circuit and the plurality of outputs, the output circuit comprising a plurality of solid state switching devices, wherein each of the two or more MOSFETS are electrically connected to a gate input of a corresponding one of the plurality of solid state switching devices.

15. The system of claim 14, wherein the plurality of the solid state switching devices comprise silicon controlled rectifiers (SCRs), triodes for alternating current (TRIACs), or gate turn-off thyristors (GTOs).

16. The system of claim 13, wherein the triggering signal provided by the MOSFETSs in series opposition configuration results in a minimized step current output at the plurality of outputs.

17. The system of claim 12, wherein the solid state switch comprises a solid state relay.

18. The system of claim 12, further comprising a control circuit, wherein the control circuit provides a direct current (DC) control signal to the plurality of inputs for enabling or disabling the solid state switch and the control circuit is electrically isolated from the plurality of inputs of the solid state switch.

19. The system of claim 18, wherein the control circuit comprises at least one of a transformer or one or more optoisolators to electrically isolate the control circuit from the solid state switch.

20. A solid state relay comprising:
a plurality of inputs;
at least two metal-oxide-semiconductor field-effect transistors (MOSFETs) connected in a series opposition arrangement, wherein a gate of each of the at least two MOSFETs is electrically connected to a corresponding one of the plurality of inputs; and
at least two semiconductor switching devices, each comprising a gate input, wherein an output of each of the at least two MOSFETs provides a triggering signal at the gate input of each of a corresponding semiconductor switching devices to enable power delivery from a power source to a load.

* * * * *

UNITED STATES PATENT AND TRADEMARK OFFICE
CERTIFICATE OF CORRECTION

| | |
|---|---|
| PATENT NO. | : 9,564,891 B1 |
| APPLICATION NO. | : 14/925694 |
| DATED | : February 7, 2017 |
| INVENTOR(S) | : Bryan Bixby |

It is certified that error appears in the above-identified patent and that said Letters Patent is hereby corrected as shown below:

In the Specification

In Column 4, Line 56:
Please delete "optocoupler 115" and insert --optocoupler 114--

In Column 7, Line 62:
Please delete "MOSFETs 220 and 230" and insert --MOSFETs 212 and 214--

In Column 9, Line 43:
Please delete "solid state relay 320." and insert --solid state relay 300.--

Signed and Sealed this
Twenty-third Day of May, 2017

Michelle K. Lee
*Director of the United States Patent and Trademark Office*